(12) United States Patent　　　　　(10) Patent No.: US 12,689,356 B2

Khlat　　　　　　　　　　　　　　　(45) Date of Patent: Jul. 21, 2026

(54) ACOUSTIC RESONATOR FILTER STRUCTURE WITH TUNABLE SHUNT COUPLED RESONATOR FILTER

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/747,555

(22) Filed: Jun. 19, 2024

(65) Prior Publication Data

US 2025/0030404 A1　　Jan. 23, 2025

Related U.S. Application Data

(60) Provisional application No. 63/513,941, filed on Jul. 17, 2023.

(51) Int. Cl.
H03H 9/56　　　　(2006.01)
H03H 9/205　　　(2006.01)

(52) U.S. Cl.
CPC ............ H03H 9/568 (2013.01); H03H 9/205 (2013.01)

(58) Field of Classification Search
CPC ...... H03H 9/542; H03H 9/605; H03H 9/6483; H03H 9/205; H03H 2210/025; H03H 2009/02204; H03H 9/568; H03H 9/54; H03H 9/60; H03H 9/64; H03H 9/6403; H03H 9/706; H03H 9/547; H03H 9/545; H03H 9/584; H03H 9/6489; H03H 9/725; H03H 2009/02196; H03H 2210/036; H03H 7/0115; H03H 7/09; H03H 9/02015; H03H 9/175; H03H 9/585; H03H 9/6409;

(Continued)

(56) References Cited

U.S. PATENT DOCUMENTS

| | | |
|---|---|---|
| 3,568,108 A | 3/1971 | Poirier et al. |
| 4,924,195 A | 5/1990 | Gonda |

(Continued)

FOREIGN PATENT DOCUMENTS

| | | |
|---|---|---|
| CN | 107727125 A | 2/2018 |
| DE | 102007028290 A1 | 1/2009 |

(Continued)

OTHER PUBLICATIONS

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

(Continued)

*Primary Examiner* — Lincoln D Donovan
*Assistant Examiner* — Tyler J Pereny
(74) *Attorney, Agent, or Firm* — Withrow & Terranova, P.L.L.C.

(57)　　　　　　　ABSTRACT

An acoustic resonator filter structure with a tunable shunt coupled resonator filter (CRF) is provided. Herein, the acoustic resonator filter structure is a stacked structure that includes a series resonator filter die and a tunable shunt CRF die. By stacking the series resonator filter die and the tunable shunt CRF die according to various embodiments, it is possible to reduce a footprint of the acoustic resonator filter structure, thus making it possible to incorporate multiple acoustic resonator filter structures in an acoustic ladder filter network.

15 Claims, 5 Drawing Sheets

(58) Field of Classification Search

CPC ... H03H 2007/013; H03H 2009/02165; H03H 2210/012; H03H 2210/015; H03H 2250/00; H03H 3/04; H03H 7/0153; H03H 7/0161; H03H 7/12; H03H 7/38; H03H 9/0004; H03H 9/52; H03H 9/589; H04B 1/006; H04B 1/0458; H04B 1/0057; H04B 1/40; H04B 1/525; H04B 1/1036; H03F 2200/294; H03F 2200/451; H03F 1/56; H03F 2200/111; H03F 3/19; H03F 2200/222; H03F 3/195; H03F 3/24

See application file for complete search history.

(56) References Cited

U.S. PATENT DOCUMENTS

| | | |
|---|---|---|
| 6,242,843 B1 | 6/2001 | Pohjonen et al. |
| 6,862,441 B2 | 3/2005 | Ella |
| 7,034,638 B2 | 4/2006 | Yamamoto et al. |
| 7,161,434 B2 | 1/2007 | Rhodes |
| 7,367,095 B2 | 5/2008 | Larson, III et al. |
| 7,454,178 B2 | 11/2008 | Block et al. |
| 7,573,354 B2 | 8/2009 | Nishihara et al. |
| 7,656,228 B2 | 2/2010 | Fukuda et al. |
| 7,659,796 B2 | 2/2010 | Funami et al. |
| 7,692,270 B2 | 4/2010 | Subramanyam et al. |
| 7,791,436 B2 | 9/2010 | Bardal et al. |
| 7,804,374 B1 | 9/2010 | Brown et al. |
| 7,876,179 B2 | 1/2011 | Bauer et al. |
| 8,269,577 B2 | 9/2012 | Inoue et al. |
| 8,576,024 B2 | 11/2013 | Erb et al. |
| 8,620,250 B2 | 12/2013 | Erb |
| 9,041,484 B2 | 5/2015 | Burgener et al. |
| 9,190,979 B2 | 11/2015 | Granger-Jones et al. |
| 9,255,912 B2 | 2/2016 | Johnston et al. |
| 9,281,800 B2 | 3/2016 | Tsuzuki |
| 9,438,202 B2 | 9/2016 | Reinhardt et al. |
| 9,583,806 B2 | 2/2017 | Cho et al. |
| 9,705,473 B2 | 7/2017 | David et al. |
| 9,819,327 B2 | 11/2017 | Maruthamuthu et al. |
| 9,847,769 B2 | 12/2017 | Khlat et al. |
| 10,009,010 B2 | 6/2018 | Kando et al. |
| 10,243,537 B2 | 3/2019 | Khlat |
| 10,425,061 B1 | 9/2019 | Varela Campelo |
| 10,447,322 B2 | 10/2019 | Wloczysiak |
| 10,476,481 B2 | 11/2019 | Chen et al. |
| 10,873,317 B2 | 12/2020 | Shen et al. |
| 10,985,731 B2 | 4/2021 | Khlat |
| 11,050,412 B2 | 6/2021 | Khlat et al. |
| 11,095,268 B2 | 8/2021 | Schmidhammer |
| 11,165,412 B2 * | 11/2021 | Khlat .................... H03H 9/205 |
| 11,165,413 B2 | 11/2021 | Khlat et al. |
| 11,323,097 B2 | 5/2022 | Kankar et al. |
| 11,742,818 B2 | 8/2023 | Khlat |
| 2002/0021192 A1 | 2/2002 | Klee et al. |
| 2002/0158717 A1 | 10/2002 | Toncich |
| 2002/0163400 A1 | 11/2002 | Toncich |
| 2003/0227338 A1 | 12/2003 | Kawakubo et al. |
| 2004/0119561 A1 | 6/2004 | Omote |
| 2006/0098723 A1 | 5/2006 | Toncich et al. |
| 2007/0030096 A1 | 2/2007 | Nishihara et al. |
| 2007/0107519 A1 | 5/2007 | Liu et al. |
| 2007/0131032 A1 | 6/2007 | Liu |
| 2007/0296513 A1 | 12/2007 | Ruile et al. |
| 2008/0024243 A1 | 1/2008 | Iwaki et al. |
| 2008/0065290 A1 | 3/2008 | Breed et al. |
| 2008/0129416 A1 | 6/2008 | Volatier et al. |
| 2009/0289526 A1 | 11/2009 | Sinha et al. |
| 2009/0315643 A1 | 12/2009 | Yamakawa et al. |
| 2010/0308933 A1 | 12/2010 | See et al. |
| 2012/0212304 A1 | 8/2012 | Zhang et al. |
| 2012/0313731 A1 | 12/2012 | Burgener et al. |
| 2013/0109332 A1 | 5/2013 | Aigner |
| 2014/0070905 A1 | 3/2014 | Raieszadeh et al. |
| 2014/0203887 A1 | 7/2014 | Murata et al. |
| 2015/0163044 A1 | 6/2015 | Analui et al. |
| 2016/0191012 A1 | 6/2016 | Khlat et al. |
| 2016/0191016 A1 | 6/2016 | Khlat et al. |
| 2016/0294423 A1 | 10/2016 | Yatsenko et al. |
| 2017/0040948 A1 | 2/2017 | Levesque |
| 2017/0048859 A1 | 2/2017 | Hayakawa |
| 2017/0093370 A1 | 3/2017 | Khlat et al. |
| 2017/0201233 A1 | 7/2017 | Khlat |
| 2017/0214389 A1 | 7/2017 | Tsutsumi |
| 2017/0230066 A1 | 8/2017 | Little et al. |
| 2017/0244382 A1 | 8/2017 | Lear |
| 2017/0264268 A1 | 9/2017 | Schmidhammer |
| 2018/0076793 A1 | 3/2018 | Khlat et al. |
| 2018/0123562 A1 | 5/2018 | Bradley |
| 2018/0159562 A1 | 6/2018 | Bauder |
| 2018/0234078 A1 | 8/2018 | Wada et al. |
| 2019/0081613 A1 | 3/2019 | Nosaka |
| 2019/0181907 A1 | 6/2019 | Pfann et al. |
| 2019/0199324 A1 | 6/2019 | Matsumoto et al. |
| 2019/0260355 A1 | 8/2019 | Khlat |
| 2019/0326944 A1 | 10/2019 | Khlat et al. |
| 2019/0393860 A1 | 12/2019 | Shih et al. |
| 2020/0028491 A1 | 1/2020 | Kuroyanagi |
| 2020/0028567 A1 | 1/2020 | Ashworth |
| 2020/0076366 A1 | 3/2020 | Bahr et al. |
| 2020/0099360 A1 | 3/2020 | Khlat |
| 2020/0099362 A1 | 3/2020 | Khlat |
| 2020/0099363 A1 | 3/2020 | Khlat |
| 2020/0099364 A1 | 3/2020 | Khlat |
| 2020/0136589 A1 | 4/2020 | Khlat |
| 2020/0162057 A1 | 5/2020 | Nakamura |
| 2020/0274519 A1 | 8/2020 | Gamble et al. |
| 2021/0067139 A1 | 3/2021 | Komatsu et al. |
| 2021/0194459 A1 | 6/2021 | Alavi et al. |
| 2021/0297097 A1 | 9/2021 | Okuda |
| 2021/0399750 A1 | 12/2021 | Varela Campelo |
| 2022/0385272 A1 | 12/2022 | Sun et al. |
| 2023/0083961 A1 | 3/2023 | Komatsu et al. |
| 2023/0093885 A1 | 3/2023 | Ella et al. |
| 2023/0134889 A1 * | 5/2023 | Costa ................. H03H 9/02228 |
| | | 333/187 |
| 2023/0216485 A1 | 7/2023 | Wu et al. |
| 2023/0223920 A1 | 7/2023 | Koohi et al. |
| 2023/0223922 A1 | 7/2023 | Koohi et al. |
| 2023/0223926 A1 | 7/2023 | Koohi et al. |
| 2023/0299746 A1 | 9/2023 | Levesque |
| 2023/0318569 A1 | 10/2023 | Jhung |
| 2023/0402992 A1 | 12/2023 | Noguchi et al. |
| 2023/0412149 A1 | 12/2023 | Khlat |
| 2024/0014803 A1 | 1/2024 | Khlat |
| 2024/0053193 A1 | 2/2024 | Khlat |
| 2024/0097650 A1 | 3/2024 | Khlat et al. |
| 2024/0213956 A1 | 6/2024 | Khlat et al. |
| 2024/0258992 A1 | 8/2024 | Khlat |
| 2024/0333257 A1 | 10/2024 | Khlat |
| 2024/0333259 A1 | 10/2024 | Khlat |
| 2024/0364309 A1 | 10/2024 | Khlat |
| 2024/0413809 A1 | 12/2024 | Khlat |

FOREIGN PATENT DOCUMENTS

| | | |
|---|---|---|
| JP | 3854212 B2 | 12/2006 |
| JP | 2009130831 A | 6/2009 |
| JP | 4326063 B2 | 9/2009 |
| JP | 2022548348 A | 11/2022 |
| RU | 166154 U1 | 11/2016 |
| WO | 2024034528 A1 | 2/2024 |

OTHER PUBLICATIONS

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State

(56) References Cited

OTHER PUBLICATIONS

University, Ames, Iowa, 2013, 127 pages.

Khan, A.I. et al., "Negative Capacitance in a Ferroelectric Capacitor," Nature Materials, vol. 14, Feb. 2015, first published Dec. 2014, Macmillan Publishers Limited, pp. 182-186.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.

Tirado, J.V., "Bulk Acoustic Wave Resonators and their Application to Microwave Devices," Ph.D Dissertation, Department of Telecommunications and Systems Engineering, Universitat Autonoma de Barcelona (UAB), 2010, 201 pages.

Qorvo US, Inc., "Acoustic LP filtering for High Frequency Spurious Harmonics Rejections," Technical Disclosure Commons, Dec. 13, 2022, Qorvo US, Inc., 8 pages.

Qorvo US, Inc., "Multipe Notch Filter Using On-Die BAW MIM Cap," Technical Disclosure Commons, Dec. 12, 2022, Qorvo US, Inc., 10 pages.

\* cited by examiner

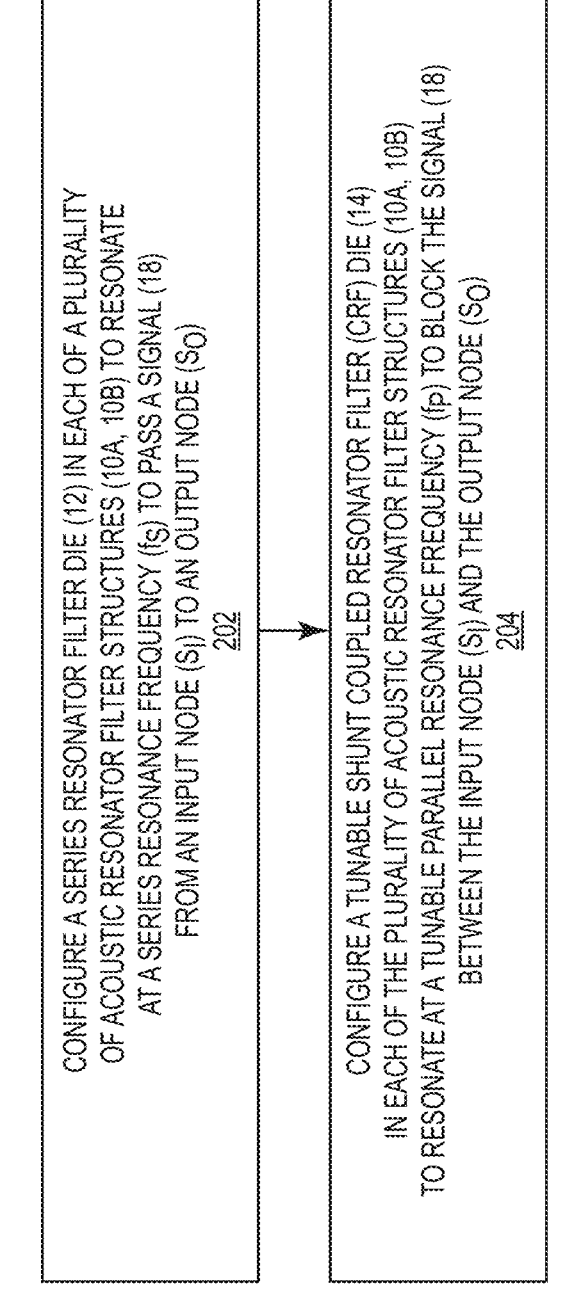

CONFIGURE A SERIES RESONATOR FILTER DIE (12) IN EACH OF A PLURALITY OF ACOUSTIC RESONATOR FILTER STRUCTURES (10A, 10B) TO RESONATE AT A SERIES RESONANCE FREQUENCY ($f_S$) TO PASS A SIGNAL (18) FROM AN INPUT NODE ($S_I$) TO AN OUTPUT NODE ($S_O$)

202

CONFIGURE A TUNABLE SHUNT COUPLED RESONATOR FILTER (CRF) DIE (14) IN EACH OF THE PLURALITY OF ACOUSTIC RESONATOR FILTER STRUCTURES (10A, 10B) TO RESONATE AT A TUNABLE PARALLEL RESONANCE FREQUENCY ($f_P$) TO BLOCK THE SIGNAL (18) BETWEEN THE INPUT NODE ($S_I$) AND THE OUTPUT NODE ($S_O$)

204

ACOUSTIC RESONATOR FILTER STRUCTURE WITH TUNABLE SHUNT COUPLED RESONATOR FILTER

RELATED APPLICATIONS

This application claims the benefit of U.S. provisional patent application Ser. No. 63/513,941, filed on Jul. 17, 2023, the disclosure of which is hereby incorporated herein by reference in its entirety.

FIELD OF THE DISCLOSURE

The technology of the disclosure relates generally to a tunable acoustic resonator filter(s) in an acoustic resonator ladder network.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications.

Ferroelectric acoustic resonators, such as ferroelectric bulk acoustic resonators (FBARs), offer ultra-small size and can operate at frequencies up to tens of gigahertz. As such, ferroelectric resonators are widely used as miniaturized filters in many high-frequency devices, such as fifth generation (5G) and 5G new radio (5G-NR) communication and/or navigation devices. The operating frequency (a.k.a. series/parallel resonance frequency) of a ferroelectric acoustic resonator is typically determined by an inner structure (e.g., thickness and elastic properties) of the ferroelectric acoustic resonator. As such, it is desirable to electrically control the ferroelectric acoustic resonator to operate at a desired operating frequency without changing the inner structure of the ferroelectric acoustic resonator.

SUMMARY

Aspects disclosed in the detailed description include an acoustic resonator filter structure with a tunable shunt coupled resonator filter (CRF). Herein, the acoustic resonator filter structure is a stacked structure that includes a series resonator filter die and a tunable shunt CRF die. By stacking the series resonator filter die and the tunable shunt CRF die according to various embodiments, it is possible to reduce a footprint of the acoustic resonator filter structure, thus making it possible to incorporate multiple acoustic resonator filter structures in an acoustic ladder filter network.

In one aspect, an acoustic resonator filter structure is provided. The acoustic resonator filter structure includes a series resonator filter die. The series resonator filter die is configured to resonate at a series resonance frequency to pass a signal from an input node to an output node. The acoustic resonator filter structure also includes a tunable shunt CRF die. The tunable shunt CRF die is configured to resonate at a tunable parallel resonance frequency to block the signal between the input node and the output node.

In another aspect, an acoustic ladder filter network is provided. The acoustic ladder filter network includes multiple acoustic resonator filter structures. Each of the acoustic resonator filter structures includes a series resonator filter die. The series resonator filter die is configured to resonate at a series resonance frequency to pass a signal from an input node to an output node. Each of the acoustic resonator filter structures also includes a tunable shunt CRF die. The tunable shunt CRF die is configured to resonate at a tunable parallel resonance frequency to block the signal between the input node and the output node.

In another aspect, a wireless device is provided. The wireless device includes at least one acoustic resonator filter structure. The at least one acoustic resonator filter structure includes a series resonator filter die. The series resonator filter die is configured to resonate at a series resonance frequency to pass a signal from an input node to an output node. The at least one acoustic resonator filter structure also includes a tunable shunt CRF die. The tunable shunt CRF die is configured to resonate at a tunable parallel resonance frequency to block the signal between the input node and the output node.

In another aspect, a method for configuring an acoustic ladder filter network is provided. The method includes configuring a series resonator filter die in each of multiple acoustic resonator filter structures to resonate at a series resonance frequency to pass a signal from an input node to an output node. The method also includes configuring a tunable shunt CRF die in each of the multiple acoustic resonator filter structures to resonate at a tunable parallel resonance frequency to block the signal between the input node and the output node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 5 is a flowchart of an exemplary process for configuring the acoustic ladder filter network of FIG. 3.

DETAILED DESCRIPTION

Figure 1:
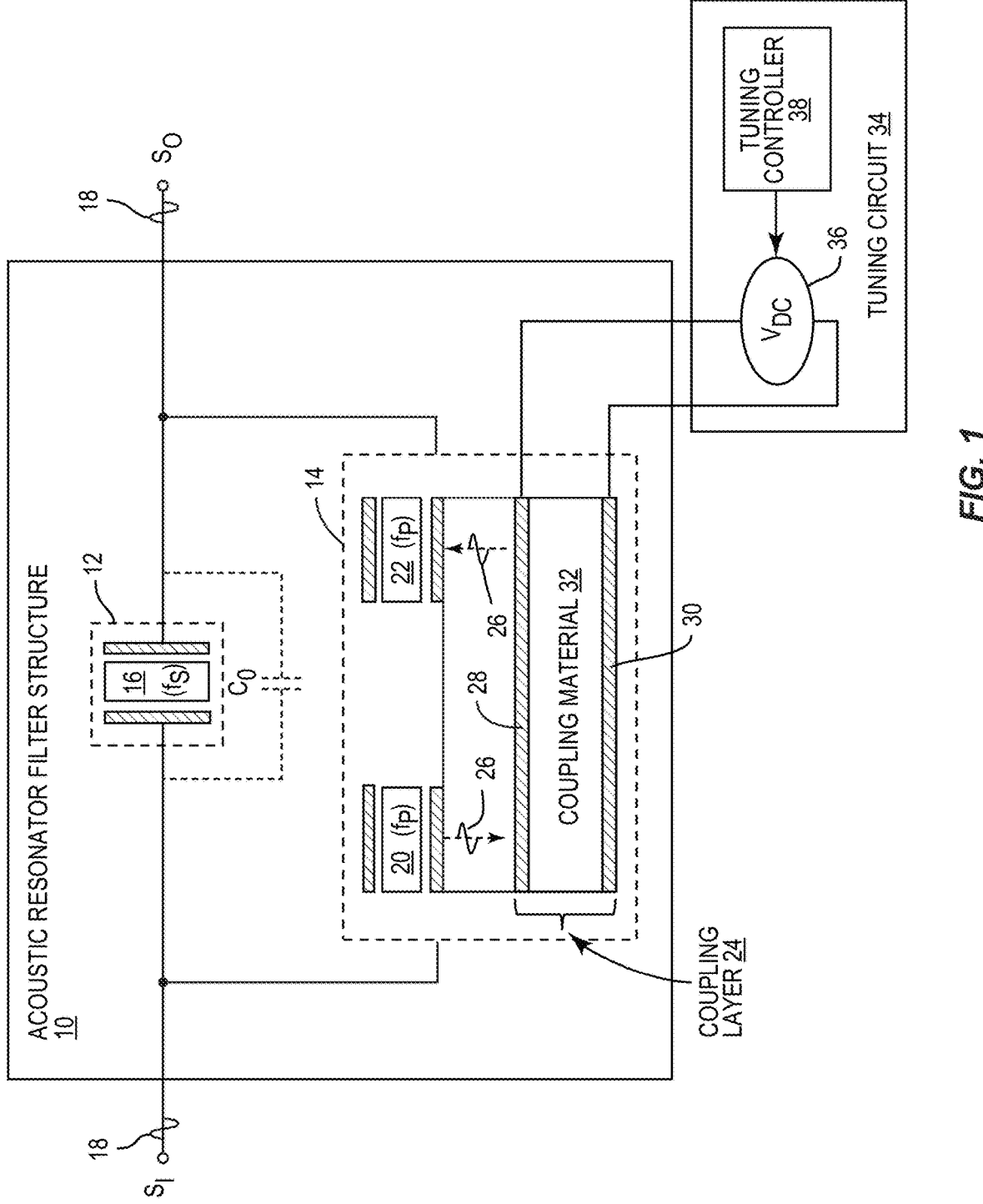
FIG. 1 is a schematic diagram of an exemplary sideview of an acoustic resonator filter structure configured to include a series resonator filter die and a tunable shunt coupled resonator filter (CRF) die.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic resonator filter structure with a tunable shunt coupled resonator filter (CRF). Herein, the acoustic resonator filter structure is a stacked structure that includes a series resonator filter die and a tunable shunt CRF die. By stacking the series resonator filter die and the tunable shunt CRF die according to various embodiments, it is possible to reduce a footprint of the acoustic resonator filter structure, thus making it possible to incorporate multiple acoustic resonator filter structures in an acoustic ladder filter network.

FIG. 1 is a schematic diagram of an exemplary acoustic resonator filter structure 10 configured to include a series resonator filter die 12 and a tunable shunt CRF die 14. Notably, the series resonator filter die 12 and the tunable shunt CRF die 14 are separate dies. In an embodiment, the series resonator filter die 12 and the tunable shunt CRF die 14 can be stacked using hybrid bonding to form the acoustic resonator filter structure 10.

In an embodiment, the series resonator filter die 12 includes a ferroelectric series resonator 16. The ferroelectric series resonator 16 is coupled between an input node $S_I$ and an output node $S_O$ and configured to resonate at a series resonance frequency $f_S$ to pass a signal 18 from the input node $S_I$ to the output node $S_O$.

The tunable shunt CRF die 14 is coupled between the input node $S_I$ and the output node $S_O$, in parallel to the series resonator filter die 12. Herein, the tunable shunt CRF die 14 includes a ferroelectric input shunt resonator 20 and a ferroelectric output shunt resonator 22. The ferroelectric input shunt resonator 20 and the ferroelectric output shunt resonator 22 are each configured to resonate at a tunable parallel resonance frequency $f_P$ ($f_P \neq f_S$) to block the signal 18 between the input node $S_I$ and the output node $S_O$.

Notably, the ferroelectric series resonator 16 can present an electrical-static capacitance $C_0$ between the input node $S_I$ and the output node $S_O$. The electrical-static capacitance $C_0$ can cause the ferroelectric series resonator 16 to resonate at a secondary frequency that falls within the tunable parallel resonance frequency $f_P$ to potentially compromise a signal rejection capability of the acoustic resonator filter structure 10. As such, it is necessary to cancel the electrical-static capacitance $C_0$ at a frequency range of interest to help improve performance of the acoustic resonator filter structure 10.

In an embodiment, the tunable shunt CRF die 14 can be tuned to create a coupling between the ferroelectric input shunt resonator 20 and the ferroelectric output shunt resonator 22 to help cancel the electrical-static capacitance $C_0$. In an embodiment, the tunable shunt CRF die 14 can include a coupling layer 24. The coupling layer 24 can be polarized relative to the ferroelectric input shunt resonator 20 and the ferroelectric output shunt resonator 22 when a tuning voltage $V_{DC}$ (e.g., 20 V) is applied to the coupling layer 24. Accordingly, the coupling acoustic behavior of the coupling layer 24 can be modified to thereby change a phase and/or amplitude of an out-of-band signal 26 coupled between the ferroelectric input shunt resonator 20 and the ferroelectric output shunt resonator 22. As a result, it is possible to cancel the electrical-static capacitance $C_0$ at the frequency range of interest and thereby improve performance of the acoustic resonator filter structure 10.

In addition, or alternative, to cancelling the electrical-static capacitance $C_0$, the tunable shunt CRF die 14 can be tuned to change the tunable parallel resonance frequency $f_P$. Understandably, by changing the tunable parallel resonance frequency $f_P$, the acoustic resonator filter structure 10 can be flexibly configured to block the signal 18 in different out-of-band frequencies.

In an embodiment, the coupling layer 24 includes a first coupling electrode 28, a second coupling electrode 30, and a coupling material 32 provided between the first coupling electrode 28 and the second coupling electrode 30. In a non-limiting example, the coupling material 32 can be a ferroelectric material. In another non-limiting example, the coupling material 32 can also be a piezoelectric semiconductor bulk acoustic wave (PS-BAW) material.

The first coupling electrode 28 and the second coupling electrode 30 may be coupled to a tuning circuit 34 that includes a voltage source 36 and a tuning controller 38. The tuning controller 38 can be configured to control the voltage source 36 to apply the tuning voltage $V_{DC}$ between the first coupling electrode 28 and the second coupling electrode 30 to thereby change the coupling acoustic behavior of the coupling layer 24.

Figures 2A, 2B:
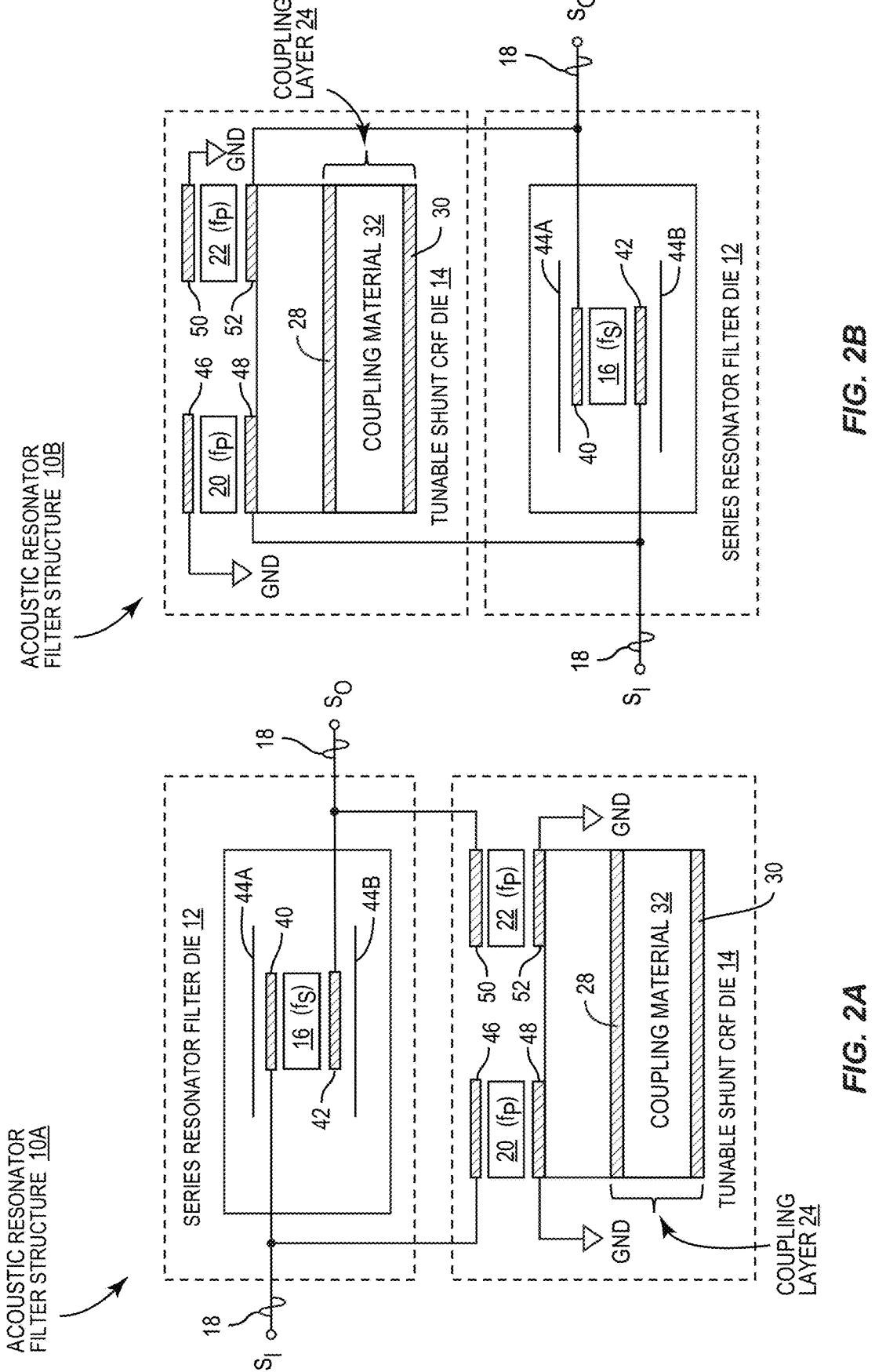
FIGS. 2A and 2B are schematic diagrams providing exemplary illustrations of the acoustic resonator filter structure in FIG. 1 that can be formed according to various embodiments of the present disclosure.

The series resonator filter die 12 and the tunable shunt CRF die 14 can be configured to form the acoustic resonator filter structure 10 based on a number of embodiments. FIGS. 2A and 2B are schematic diagrams providing exemplary illustrations of the acoustic resonator filter structure 10 in FIG. 1 that can be formed based on various embodiments of the present disclosure. Common elements between FIGS. 1, 2A, and 2B are shown therein with common element numbers and will not be re-described herein.

FIG. 2A illustrates an acoustic resonator filter structure 10A formed by stacking the series resonator filter die 12 atop the tunable shunt CRF die 14. The ferroelectric series resonator 16 includes a series input electrode 40 and a series output electrode 42. The series input electrode 40 is coupled to the input node $S_I$ and the series output electrode 42 is coupled to the output node $S_O$. The series resonator filter die 12 further includes a pair of reflectors 44A, 44B provided above and below the ferroelectric series resonator 16. In a non-limiting example, the reflectors 44A, 44B can be Bragg reflectors when the ferroelectric series resonator 16 is a bulk acoustic wave (BAW) resonator. By providing the reflectors 44A, 44B in the series resonator filter die 12, it is possible to prevent acoustic leakage from the series resonator filter die 12 to the tunable shunt CRF die 14.

The ferroelectric input shunt resonator 20 includes a first input shunt electrode 46 and a second input shunt electrode 48. The first input shunt electrode 46 is coupled to the series input electrode 40 and the second input shunt electrode 48 is coupled to a ground (GND). The ferroelectric output shunt resonator 22 includes a first output shunt electrode 50 and a second output shunt electrode 52. The first output shunt electrode 50 is coupled to the series output electrode 42 and the second output shunt electrode 52 is coupled to the GND.

FIG. 2B illustrates an acoustic resonator filter structure 10B formed by stacking the series resonator filter die 12 underneath the tunable shunt CRF die 14. Herein, the series input electrode 40 is coupled to the output node $S_O$ and the series output electrode 42 is coupled to the input node $S_I$. The first input shunt electrode 46 is coupled to the GND and the second input shunt electrode 48 is coupled to the series output electrode 42. The first output shunt electrode 50 is coupled to the GND and the second output shunt electrode 52 is coupled to the series input electrode 40.

Figure 3:
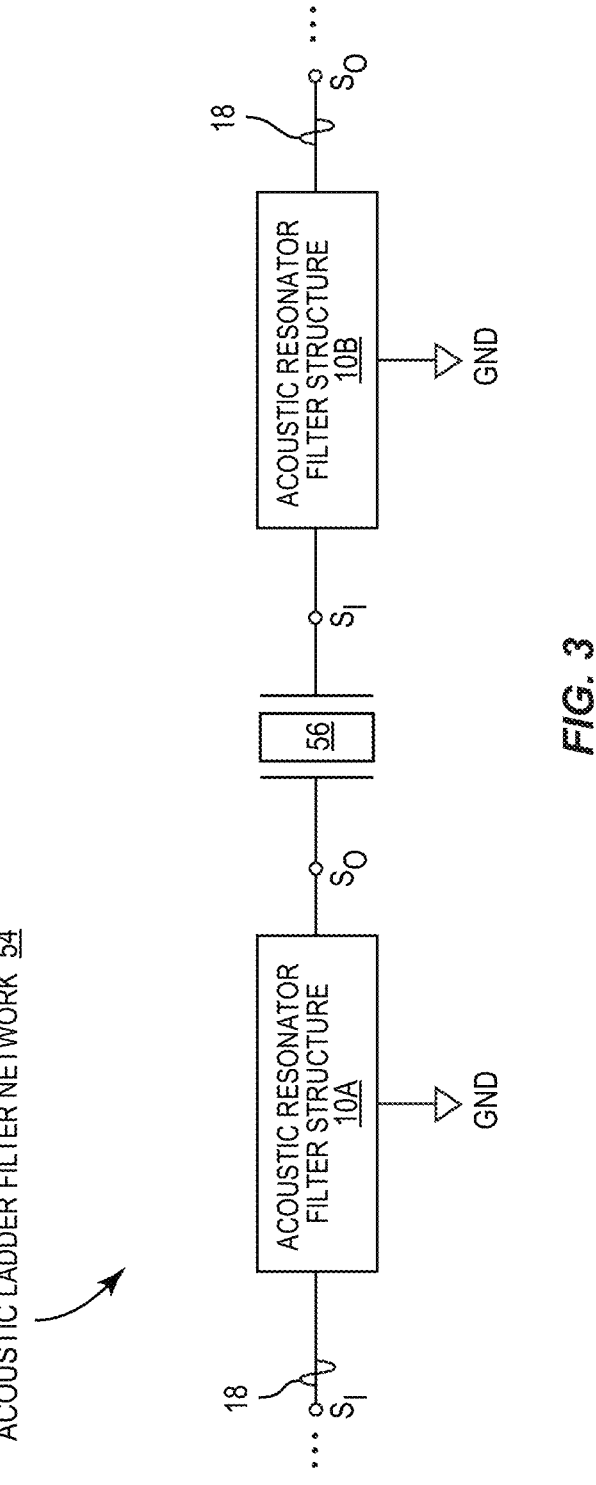
FIG. 3 is a schematic diagram of an exemplary acoustic ladder filter network incorporating one or more of the acoustic resonator filter structures in FIG. 1.

The acoustic resonator filter structure 10A of FIG. 2A and/or the acoustic resonator filter structure 10B of FIG. 2B can be provided in an acoustic ladder filter network. FIG. 3 is a schematic diagram of an exemplary acoustic ladder filter network 54 configured according to an embodiment of the present disclosure.

In an embodiment, the acoustic ladder filter network 54 may be formed by the acoustic resonator filter structure 10A of FIG. 2A, a conventional resonator filter 56, and the acoustic resonator filter structure 10B of FIG. 2B that are coupled in series. In another embodiment, the acoustic ladder filter network 54 may be formed without the conventional resonator filter 56. In another embodiment, it is also possible to form the acoustic ladder filter network 54 with multiple acoustic resonator filter structures 10A or multiple acoustic resonator filter structures 10B, with or without the conventional resonator filter 56.

Figure 4:
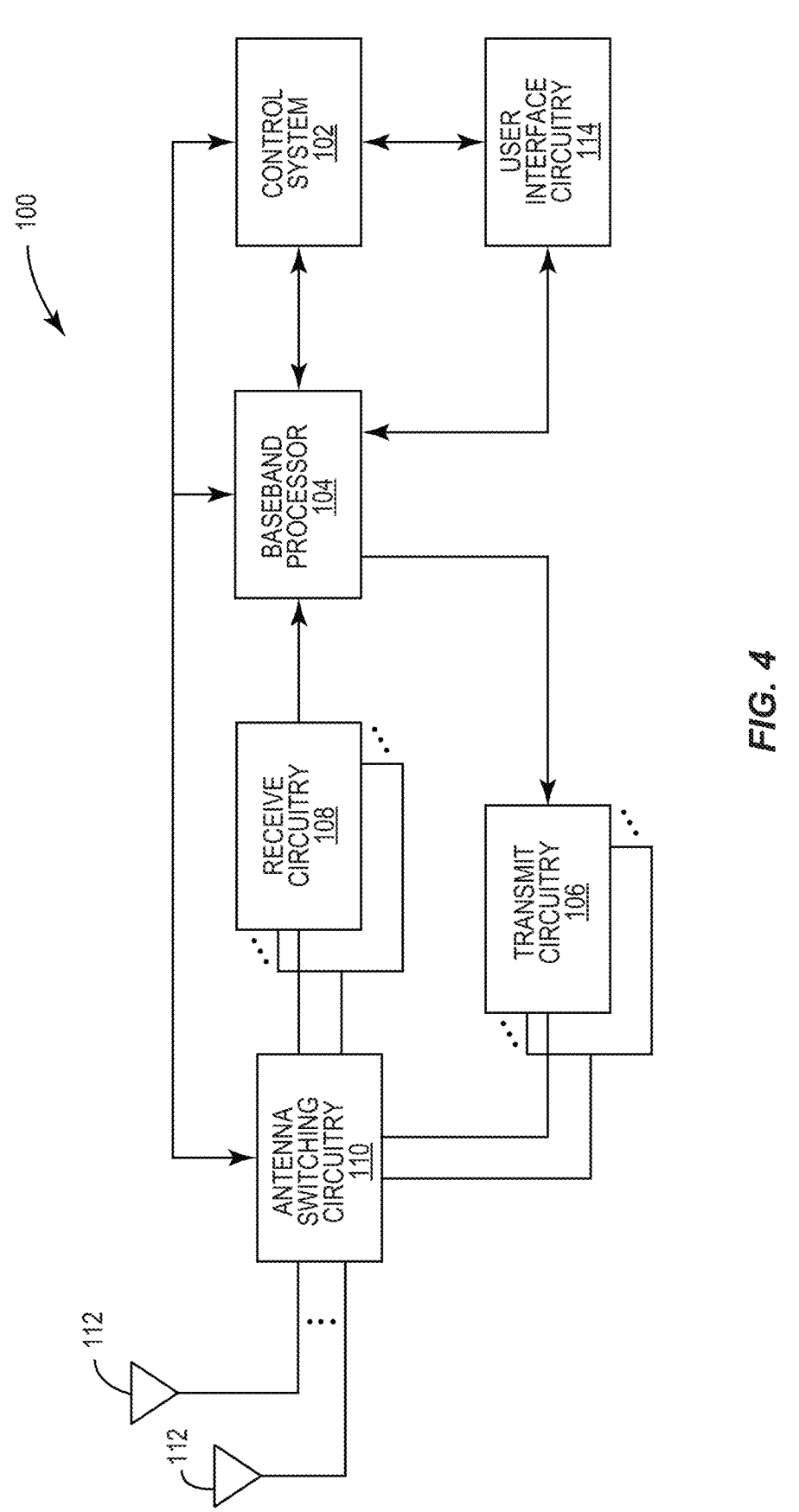
FIG. 4 is a schematic diagram of an exemplary communication device wherein the acoustic resonator filter structure of FIGS. 1, 2A, 2B and the acoustic ladder filter network of FIG. 3 can be provided.

The acoustic resonator filter structure 10 of FIG. 1, the acoustic resonator filter structure 10A of FIG. 2A, the acoustic resonator filter structure 10B of FIG. 2B, and the acoustic ladder filter network 54 of FIG. 3 can be provided in a communication device to enable the embodiments described above. In this regard, FIG. 4 is a schematic diagram of an exemplary communication device 100 wherein the acoustic resonator filter structure 10 of FIG. 1, the acoustic resonator filter structure 10A of FIG. 2A, the acoustic resonator filter structure 10B of FIG. 2B, and the acoustic ladder filter network 54 of FIG. 3 can be provided.

Herein, the communication device 100 can be any type of communication device, such as a mobile terminal, smart watch, tablet, computer, navigation device, access point, and like wireless communication devices that support wireless communications, such as cellular, wireless local area network (WLAN), Bluetooth, and near field communications. The communication device 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit (s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter (s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

In an embodiment, the acoustic resonator filter structure 10 of FIG. 1, the acoustic resonator filter structure 10A of FIG. 2A, the acoustic resonator filter structure 10B of FIG.

2B, and the acoustic ladder filter network 54 of FIG. 3 can be provided in any of the circuitries in the communication device 100.

In an embodiment, the acoustic ladder filter network 54 of FIG. 3 can be configured according to a process. In this regard, FIG. 5 is a flowchart of an exemplary process 200 for configuring the acoustic ladder filter network 54 of FIG. 3.

Herein, the process 200 includes configuring the series resonator filter die 12 in each of the acoustic resonator filter structures 10A, 10B to resonate at the series resonance frequency $f_S$ to pass the signal 18 from the input node $S_I$ to the output node $S_O$ (step 202). The process 200 also includes configuring the tunable shunt CRF die 14 in each of the acoustic resonator filter structures 10A, 10B to resonate at the tunable parallel resonance frequency $f_P$ to block the signal 18 between the input node $S_I$ and the output node $S_O$ (step 204).

Those skilled in the art will recognize improvements and modifications to the embodiments of the present disclosure. All such improvements and modifications are considered within the scope of the concepts disclosed herein and the claims that follow.

What is claimed is:

1. An acoustic resonator filter structure comprising:
   a series resonator filter die configured to resonate at a series resonance frequency to pass a signal from an input node to an output node; and
   a tunable shunt coupled resonator filter (CRF) die configured to resonate at a tunable parallel resonance frequency to block the signal between the input node and the output node, the tunable shunt CRF die comprises:
      a ferroelectric input shunt resonator coupled to the input node and configured to resonate at the tunable parallel resonance frequency;
      a ferroelectric output shunt resonator coupled to the output node and configured to resonate at the tunable parallel resonance frequency; and
      a coupling layer configured to be polarized relative to the ferroelectric input shunt resonator and the ferroelectric output shunt resonator to thereby modify the tunable parallel resonance frequency.

2. The acoustic resonator filter structure of claim 1, wherein the series resonator filter die is disposed atop the tunable shunt CRF die.

3. The acoustic resonator filter structure of claim 2, wherein the series resonator filter die comprises:
   a ferroelectric series resonator configured to resonate at the series resonance frequency; and
   a pair of reflectors provided above and below the ferroelectric series resonator.

4. The acoustic resonator filter structure of claim 2, wherein the coupling layer is coupled to a tuning circuit and configured to be polarized relative to the ferroelectric input shunt resonator and the ferroelectric output shunt resonator in response to receiving a tuning voltage from the tuning circuit.

5. The acoustic resonator filter structure of claim 1, wherein the series resonator filter die is disposed underneath the tunable shunt CRF die.

6. The acoustic resonator filter structure of claim 5, wherein the series resonator filter die comprises:
   a ferroelectric series resonator configured to resonate at the series resonance frequency; and
   a pair of reflectors provided above and below the ferroelectric series resonator.

7. The acoustic resonator filter structure of claim 5, wherein the coupling layer is coupled to a tuning circuit and configured to be polarized relative to the ferroelectric input shunt resonator and the ferroelectric output shunt resonator in response to receiving a tuning voltage from the tuning circuit.

8. An acoustic ladder filter network comprising a plurality of acoustic resonator filter structures each comprising:
   a series resonator filter die configured to resonate at a series resonance frequency to pass a signal from an input node to an output node; and
   a tunable shunt coupled resonator filter (CRF) die configured to resonate at a tunable parallel resonance frequency to block the signal between the input node and the output node;
   wherein each pair of the plurality of acoustic resonator filter structures is separated by a conventional resonator filter.

9. A wireless device comprising at least one acoustic resonator filter structure, the at least one acoustic resonator filter structure comprises:
   a series resonator filter die configured to resonate at a series resonance frequency to pass a signal from an input node to an output node; and
   a tunable shunt coupled resonator filter (CRF) die configured to resonate at a tunable parallel resonance frequency to block the signal between the input node and the output node, the tunable shunt CRF die comprises:
      a ferroelectric input shunt resonator coupled to the input node and configured to resonate at the tunable parallel resonance frequency;
      a ferroelectric output shunt resonator coupled to the output node and configured to resonate at the tunable parallel resonance frequency; and
      a coupling layer configured to be polarized relative to the ferroelectric input shunt resonator and the ferroelectric output shunt resonator to thereby modify the tunable parallel resonance frequency.

10. The wireless device of claim 9, wherein:
   the series resonator filter die is disposed atop the tunable shunt CRF die;
   the series resonator filter die comprises:
      a ferroelectric series resonator configured to resonate at the series resonance frequency; and
      a pair of reflectors provided above and below the ferroelectric series resonator.

11. The wireless device of claim 10, wherein the coupling layer is coupled to a tuning circuit and configured to be polarized relative to the ferroelectric input shunt resonator and the ferroelectric output shunt resonator in response to receiving a tuning voltage from the tuning circuit.

12. The wireless device of claim 9, wherein the series resonator filter die is disposed underneath the tunable shunt CRF die.

13. The wireless device of claim 12, wherein the series resonator filter die comprises:
   a ferroelectric series resonator configured to resonate at the series resonance frequency; and
   a pair of reflectors provided above and below the ferroelectric series resonator.

14. The wireless device of claim 12, wherein the coupling layer is coupled to a tuning circuit and configured to be polarized relative to the ferroelectric input shunt resonator and the ferroelectric output shunt resonator in response to receiving a tuning voltage from the tuning circuit.

15. A method for configuring an acoustic ladder filter network comprising:

configuring a series resonator filter die in each of a plurality of acoustic resonator filter structures to resonate at a series resonance frequency to pass a signal from an input node to an output node;

configuring a tunable shunt coupled resonator filter (CRF) die in each of the plurality of acoustic resonator filter structures to resonate at a tunable parallel resonance frequency to block the signal between the input node and the output node; and separating each pair of the plurality of acoustic resonator filter structures by a conventional resonator filter.

\* \* \* \* \*